United States Patent
Shirk/Heath et al.

(10) Patent No.: US 10,804,629 B2
(45) Date of Patent: Oct. 13, 2020

(54) BEVELING STAGGERED CARD EDGES

(71) Applicant: International Business Machines Corporation, Armonk, NY (US)

(72) Inventors: Sandra Shirk/Heath, Rochester, MN (US); Paul Schaefer, Rochester, MN (US); Mark Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 15/822,544

(22) Filed: Nov. 27, 2017

(65) Prior Publication Data

US 2019/0165505 A1    May 30, 2019

(51) Int. Cl.
| | |
|---|---|
| *A24F 13/00* | (2006.01) |
| *H01R 12/72* | (2011.01) |
| *H01R 43/16* | (2006.01) |
| *H05K 1/11* | (2006.01) |

(52) U.S. Cl.
CPC ............ *H01R 12/721* (2013.01); *H01R 43/16* (2013.01); *H05K 1/117* (2013.01); *H05K 2201/09709* (2013.01)

(58) Field of Classification Search
CPC .... H01R 12/73; H01R 12/737; H01R 12/712; H05K 1/117
USPC .......................................... 439/951, 60, 937
See application file for complete search history.

(56) References Cited

U.S. PATENT DOCUMENTS

| | | |
|---|---|---|
| 5,092,782 A | 3/1992 | Beaman |
| 5,971,680 A | 10/1999 | Kuo |
| 6,452,114 B1 | 9/2002 | Schweitzer et al. |
| 6,814,583 B1 | 11/2004 | Young et al. |
| 6,930,889 B2 | 8/2005 | Harrison et al. |
| 7,547,213 B2 * | 6/2009 | Pax ......................... H05K 1/117 174/250 |
| 8,308,490 B2 | 11/2012 | Molnar et al. |

(Continued)

FOREIGN PATENT DOCUMENTS

| | | |
|---|---|---|
| CN | 102451931 A | 5/2012 |
| CN | 204504331 U | 7/2015 |
| WO | 2015084325 A1 | 6/2015 |

OTHER PUBLICATIONS

IBM et al., "PC Laminated Connectors," An IP.com Prior Art Database Technical Disclosure, Original Disclosure Information: TDB 03-78 p. 3873-3874, Original Publication Date: Mar. 1, 1978, IP.com Electronic Publication Date: Feb. 20, 2005, 3 pages, IP.com No. IPCOM000068889D.

*Primary Examiner* — Phuong K Dinh

(74) *Attorney, Agent, or Firm* — Jared C. Chaney

(57) ABSTRACT

The present invention provides a method, structure, and system of beveling staggered card edges. In some embodiments, the method, computer program product, and system include receiving a card with a plug end and two or more metal contact leads running up to the plug end, removing material from the plug end such that one or more engagement points for one or more of the leads are set back from the plug end resulting in staggered steps, where an engagement point is where a metal contact lead will enter a receptacle, and removing material from an edge formed for each engagement point of the card such that beveled edges are created at the one or more engagement points for each lead.

19 Claims, 10 Drawing Sheets

(56) References Cited

U.S. PATENT DOCUMENTS

2007/0099443 A1\* 5/2007 Pax .................. H05K 1/117
439/55

\* cited by examiner

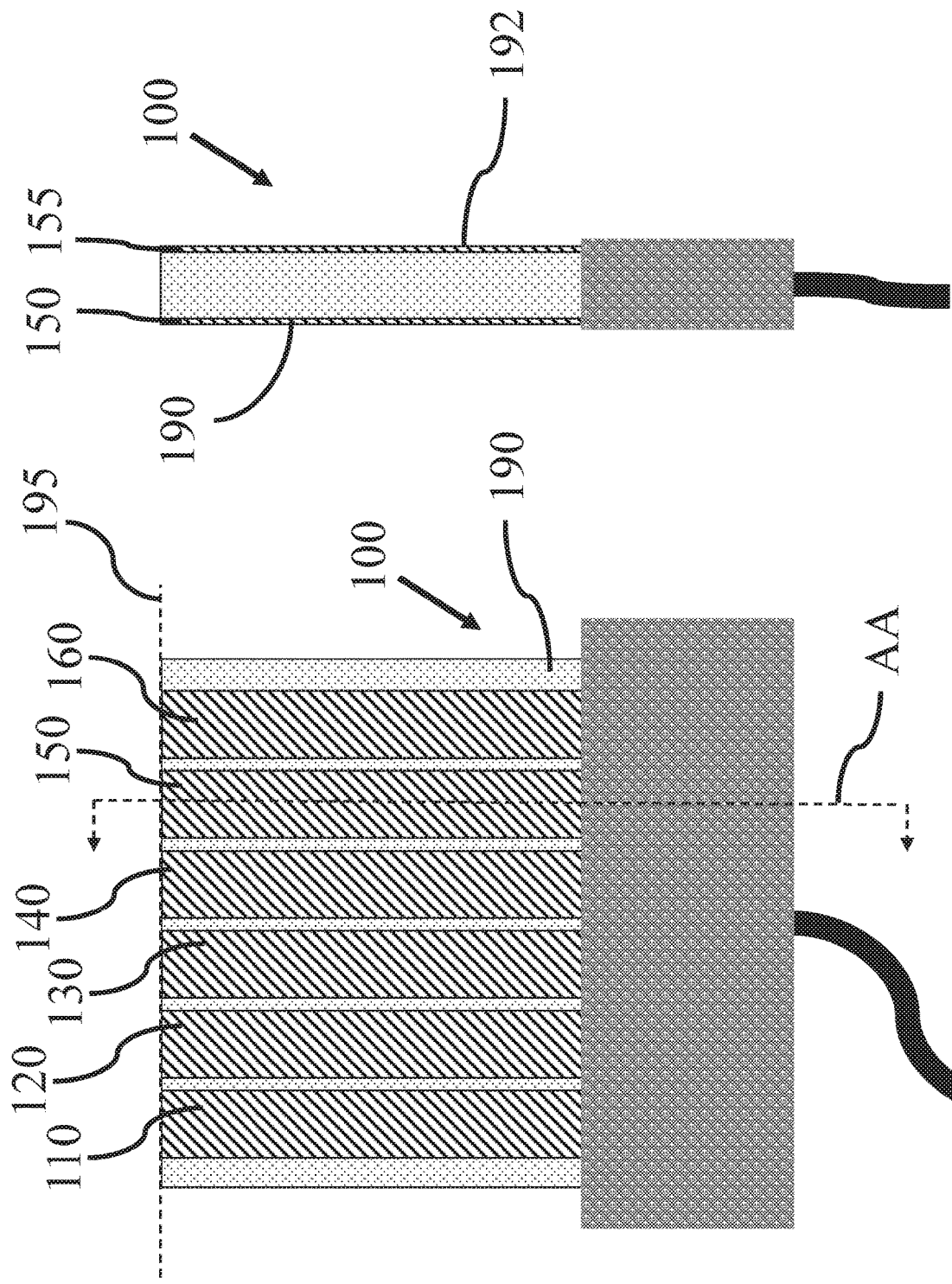

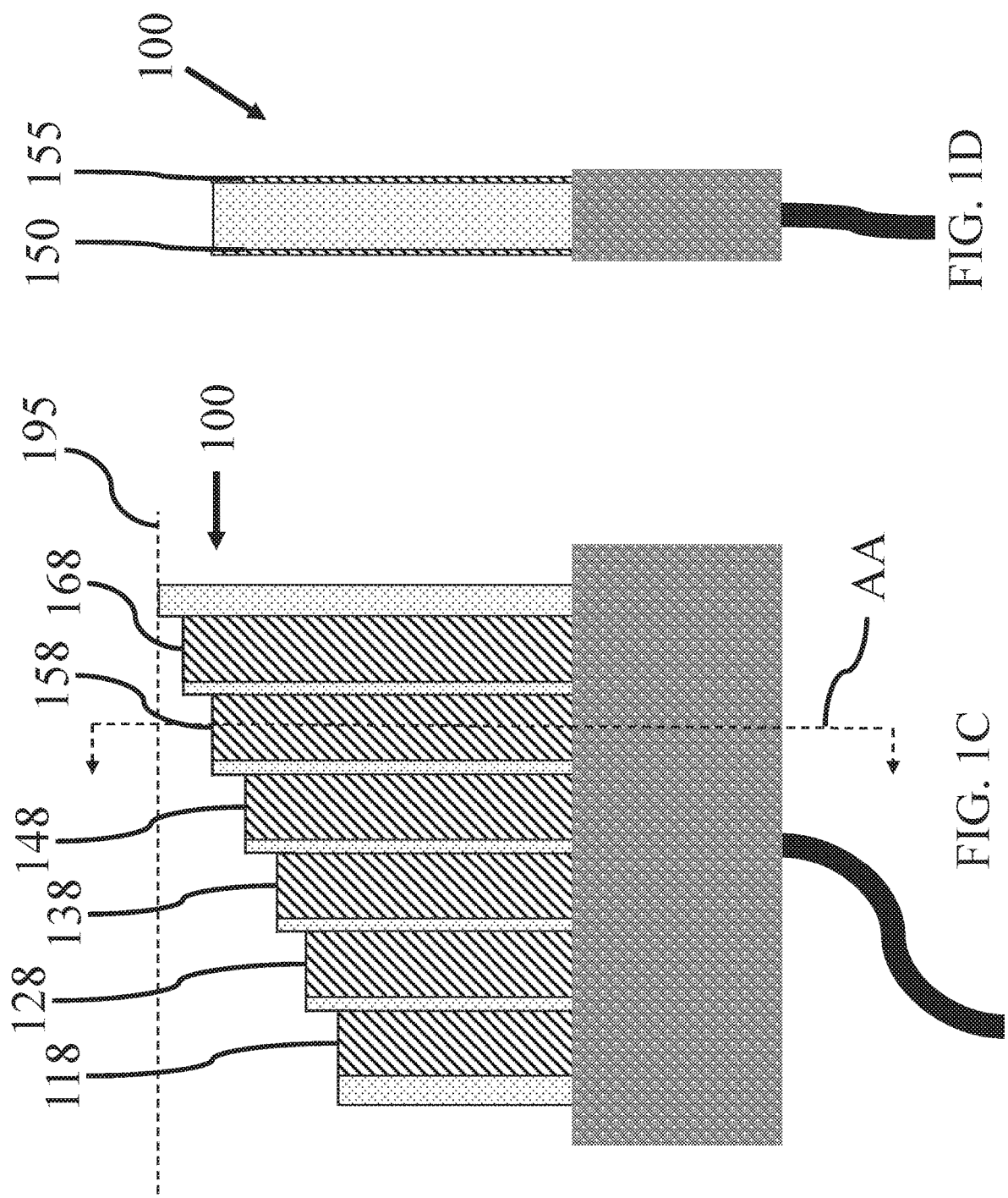

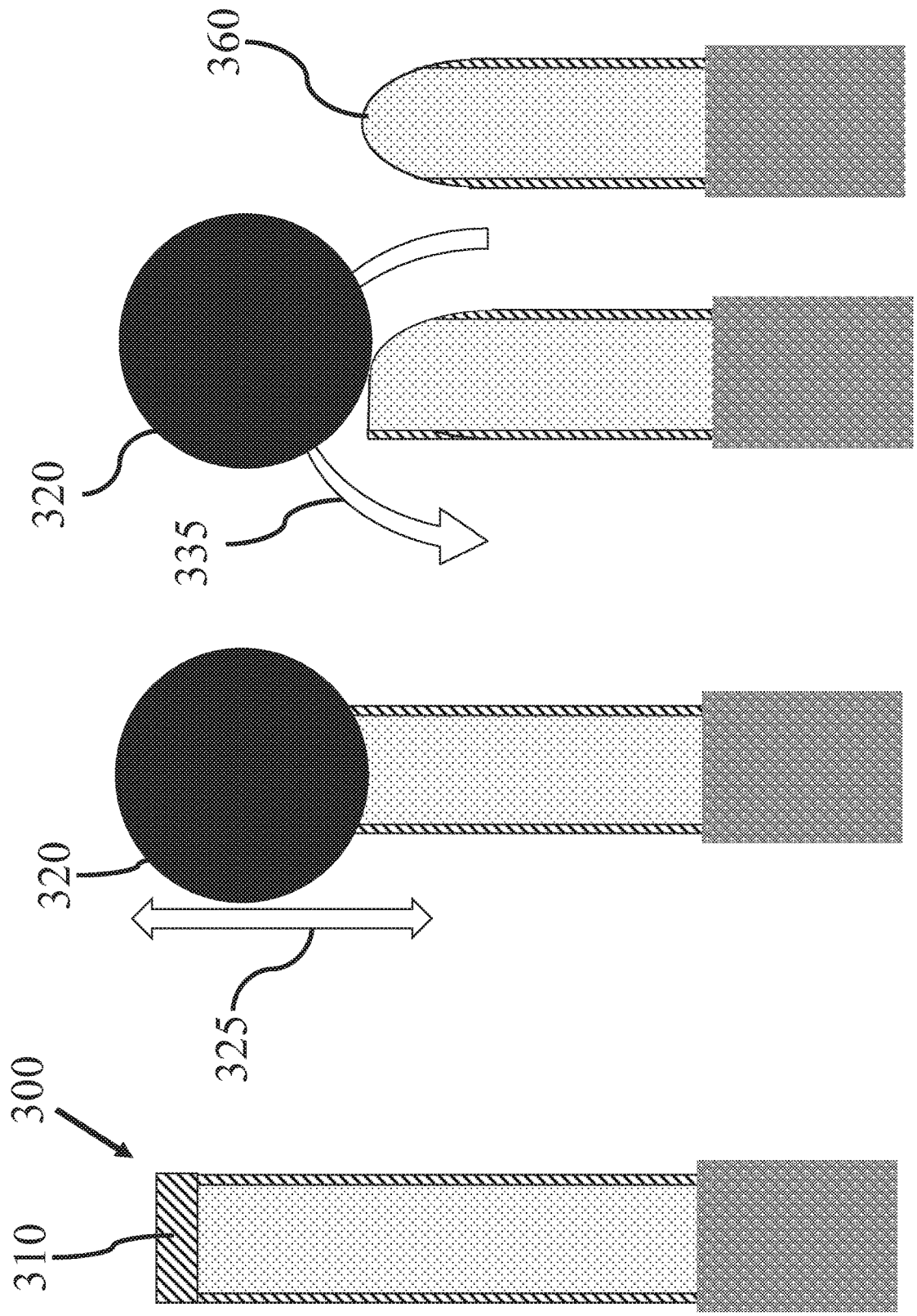

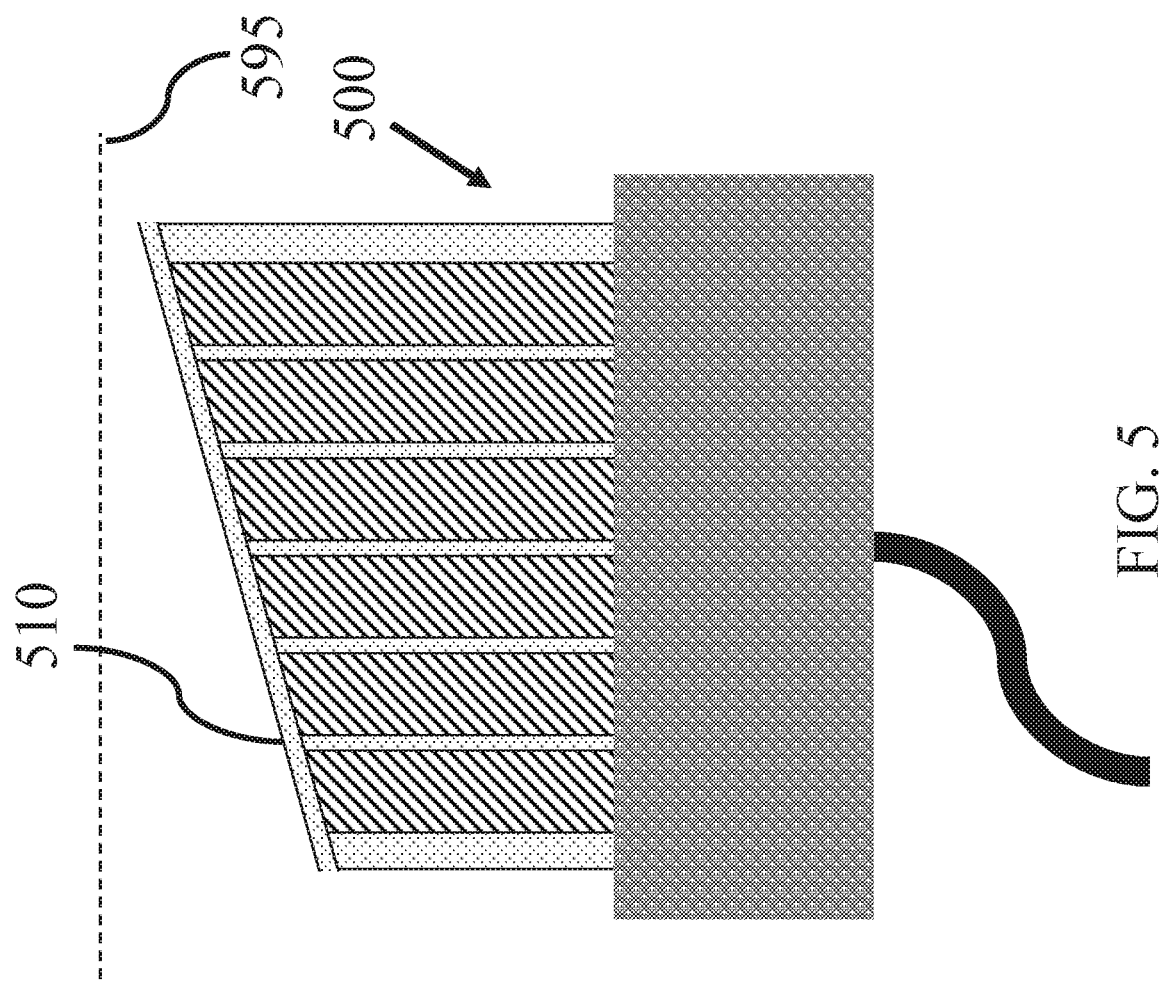

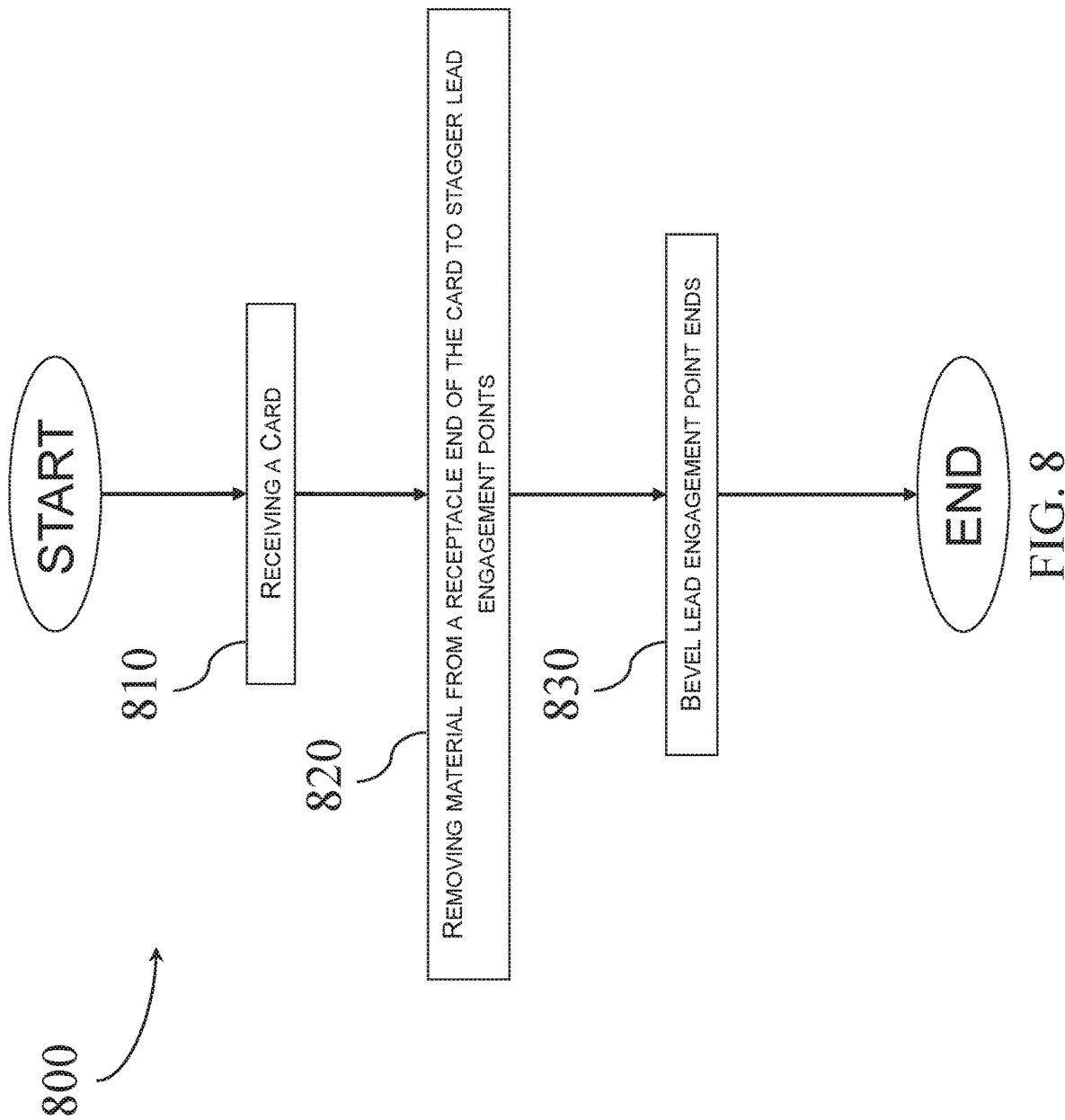

BEVELING STAGGERED CARD EDGES

BACKGROUND

The present disclosure relates to electrical component processing, and more specifically, to beveling staggered card edges.

Electrical component plugs provide data and electrical connections for many types of electronic devices. Electronic plugs may include internal plugs or external plugs. Electronic plugs may be utilized in computing devices to allow multiple components to connect to a computing device. In some applications, plugs are used to access the data bus of a computing device (the communications channel on the motherboard that connects the processor, RAM, and other components). Plugs are connected via some kind of port (also called an I/O port, for input/output for some applications) on the computing device.

SUMMARY

The present invention provides a method, structure, and system of beveling staggered card edges. In some embodiments, the method and computer program product include receiving a card with a plug end and two or more metal contact leads running up to the plug end, removing material from the plug end such that one or more engagement points for one or more of the leads are set back from the plug end resulting in staggered steps, where an engagement point is where a metal contact lead will enter a receptacle, and removing material from an edge formed for each engagement point of the card such that beveled edges are created at the one or more engagement points for each lead.

In some embodiments, the system includes a first mechanism for removing material from an edge of a card, and a second mechanism for removing material from the edge of the card, where the first mechanism removes material from the edge such that one or more engagement points for one or more leads on the card are set back from the edge forming staggered steps, where the second mechanism removes material from the edge of the card such that beveled edges are created at the one or more engagement points for each of the one or more leads.

BRIEF DESCRIPTION OF THE DRAWINGS

The present description will be better understood from the following detailed description read in light of the accompanying drawings, wherein:

FIG. 1A is as diagram illustrating components of a plug with a card according to some illustrative embodiments.

FIG. 1B is as diagram illustrating components of a cross section of a plug with a card according to some illustrative embodiments.

FIG. 1C is as diagram illustrating components of a plug with a card according to some illustrative embodiments.

FIG. 1D is as diagram illustrating components of a cross section of a plug with a card according to some illustrative embodiments.

FIG. 3A is as diagram illustrating components of a cross section of a plug with a card according to some illustrative embodiments.

FIG. 3B is as diagram illustrating components of a cross section of a plug with a card according to some illustrative embodiments.

FIG. 3C is as diagram illustrating components of a cross section of a plug with a card according to some illustrative embodiments.

FIG. 3D is as diagram illustrating components of a cross section of a plug with a card according to some illustrative embodiments.

FIG. 5 is as diagram illustrating components of a plug with a card according to some illustrative embodiments.

FIG. 8 is a flow diagram illustrating a process for identifying files as potential or actual malware according to some illustrative embodiments.

DETAILED DESCRIPTION

Figure 1E:
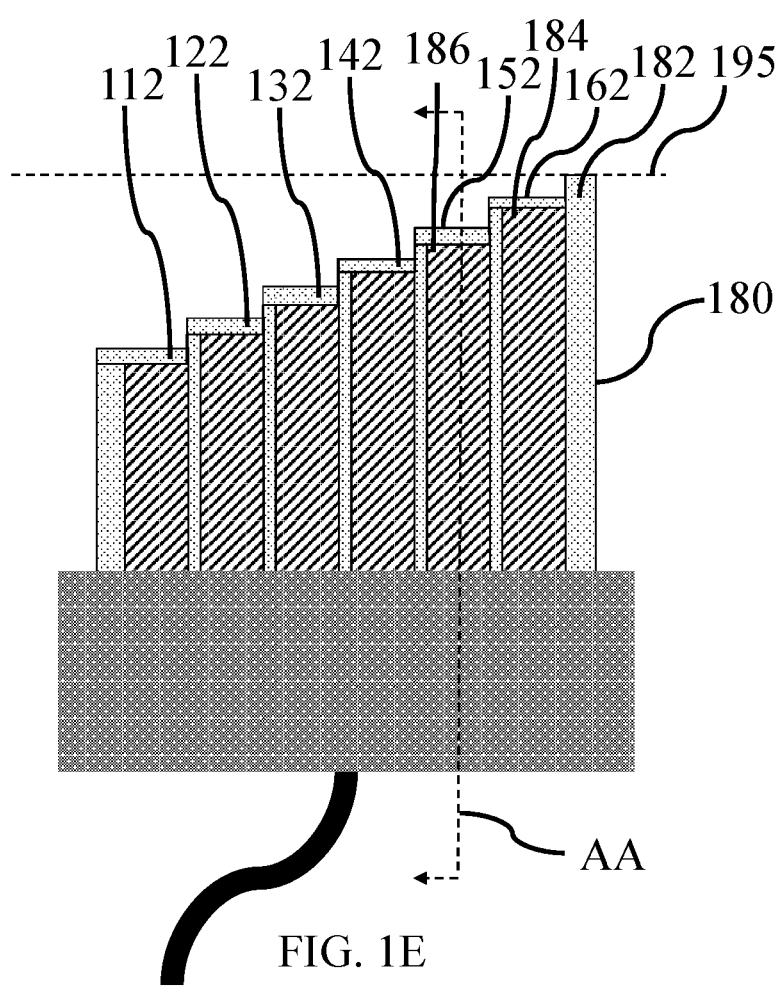
FIG. 1E is as diagram illustrating components of a plug with a card according to some illustrative embodiments.

The process of beveling staggered card edges rounds or bevels two or more offset edges on one side of a card. Many electrical plugs (male end of an electrical connection) have a card (e.g. paddle card) with a series of pin connectors attached to one or both sides of the card running up to a plug end of the card. As the card is plugged into a receptacle (female end of the electrical connection or jack) contact points, matching lead lines on the card, press against the edge and face of a card to facilitate contact with the lead lines when mated. When initially plugging in the card, the force required to overcome the pressure exerted by the contact points can be significant. Staggering or stepping the plug end of the card will reduce the maximum force required to insert the card by making one or more of the contact points engage the card separately from one or more of the other contact points. In some embodiments, the card is a card in a peripheral component interconnect (PCI), universal serial bus (USB), common transceiver (X) pluggable (CXP), flexible service processor (FSP), or other high performance electrical connection.

A card has a top side, a bottom side, and four edges. At least one of the four edges is a plug edge, i.e. an edge that plugs into a receptacle. In high performance cables or card connectors, the plug forces can be very high, for example, due to the high number of connector contacts being engaged at the same time. The card metal pads or leads on the cable paddlecard are often staggered in length to provide early/late mate (i.e., lead distance from the forefront edge of the card is changed), but the entire paddlecard engages the cable connector contacts at the same time. Staggering the paddlecard edge would create edge card engagement at different locations, which would reduce the maximum required plug force at any one time. However, staggered card edges are not used today because there is no process for creating a bevel on the staggered edges, and beveling is needed to reduce wear on the card.

Beveling the card edge is necessary to reduce/eliminate removal of the plated metal on the connector contacts. It also reduces initial deflection for the connector contacts. In some embodiments, the current disclosure provides a method to add the lead-in or bevel with a controlled repeatable method on a staggered card edge. In some embodiments, the card is a connection card or a paddle card in a plug.

FIG. 1A is a diagram illustrating a substrate 100 before staggered edge processing. FIG. 1B is a cross sectional diagram of substrate 100 at cross section line AA before staggered edge processing. Before processing, in some embodiments, substrate 100 includes a top side 190 and a bottom side 192 with a leading edge side 195. In some embodiments, metal leads 110, 120, 130, 140, 150, 155, and 160 are, at least partially, deposited up to a leading edge side 195 before the staggering and beveling described in this disclosure. In some embodiments, metal leads 110, 120, 130, 140, 150, 155, and 160 are, at least partially, deposited after the staggering and beveling described in this disclosure. The FIGs. show metal leads already deposited before the staggering and beveling, but it does not need to be so for all embodiments. Likewise, the configuration of substrate 100 is in the form of a plug, but the substrate can be any card that can be processed with an aspect of the current disclosure. For example, substrate 100 can be a connector system, a high-performance cable, a computer card, any electronic card requiring an electrical connection to one or more edges. The substrate is depicted as a substantially finished plug for explanation purposes, the method described herein can be used at any stage in the processing of a card. In some embodiments, there are metal leads on both top side 190 and bottom side 192. The leads on the front can correspond to leads on the back, such as metal leads 150 and 155.

FIG. 1C is a diagram illustrating a substrate 100 after staggered edge processing and before beveling. FIG. 1D is a cross sectional diagram of substrate 100 at cross section line AA before staggered edge processing and before beveling. After staggered edge processing, in some embodiments, material is removed from substrate 100 such that engagement points 118, 128, 138, 148, 158, and 168 are formed for one or more of the metal leads 110, 120, 130, 140, 150, 155, and 160. The removing of material sets engagement points 118, 128, 138, 148, 158, and 168 further back from leading edge side 195 creating a staggered step formation. This is performed by any method for removing material such as grinding, cutting, laser cutting, plasma cutting, laser ablation, plasma etching, chemical etching, etc. In some embodiments, an engagement point is an area of a card edge that will first engage with a receptacle. In some embodiments, each engagement points 118, 128, 138, 148, 158, and/or 168 can be set back at a varying degree depending on the need of the application. For example, FIG. 1C shows the staggered step formation where engagement point 168 would be the first to enter a receptacle followed by 158, and so on until the last engagement point 118 enters the receptacle. In this configuration, or other embodiments, the force needed to insert substrate 100 into a receptacle is separated into segments, as each engagement point contacts the receptacle only a fraction of the overall force is required at any time, whereas a configuration with all engagement points engaging the receptacle at the same time would require the force needed for each engagement point at the same time.

Any other configuration with multiple engagement points is possible. For example, in FIG. 2, the engagement points for lead lines 210, 230, and 250 are at the same point, where engagement points for 220, 240, and 260 are staggered. Other examples can have multiple engagement points at multiple levels.

FIG. 1E is an example card for an electronic device with a plug end, wherein the plug end is to be plugged into a receptacle, staggered steps (e.g., 182, 184, and 186) on the plug end corresponding to one or more metal leads on the card, wherein each metal lead on the card is isolated on a single staggered step, wherein each staggered step has a different distance from an outermost edge 195 of the card, beveled edges on at least the staggered steps, and a progressive stepping of each staggered step such that, starting at a first side 180 of the card, a first step 182 is at the outermost edge of the card, a second step 184 is a first distance away from the outermost edge, and a third step 186 is a second distance away from the outermost edge, wherein the second distance is greater than the first, wherein the side of the card is perpendicular to the outermost edge of the card, wherein the second step abuts the first step and the third step abuts the second step.

Figure 1F:
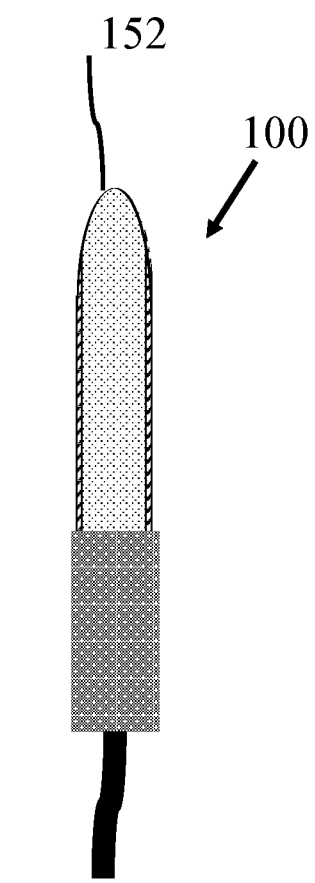
FIG. 1F is as diagram illustrating components of a cross section of a plug with a card according to some illustrative embodiments.
Figure 4C:
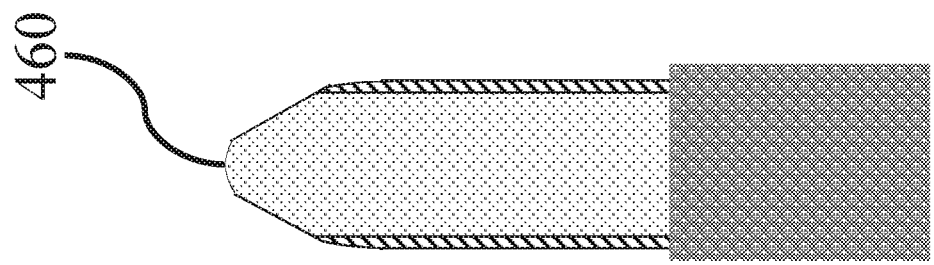
FIG. 4C is as diagram illustrating components of a cross section of a plug with a card according to some illustrative embodiments.
Figure 4B:
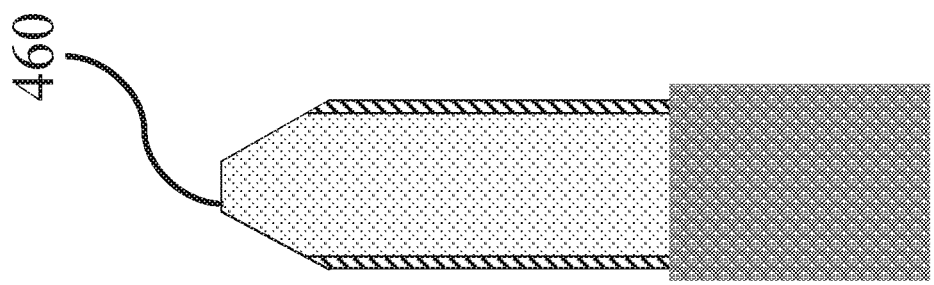
FIG. 4B is as diagram illustrating components of a cross section of a plug with a card according to some illustrative embodiments.
Figure 4A:
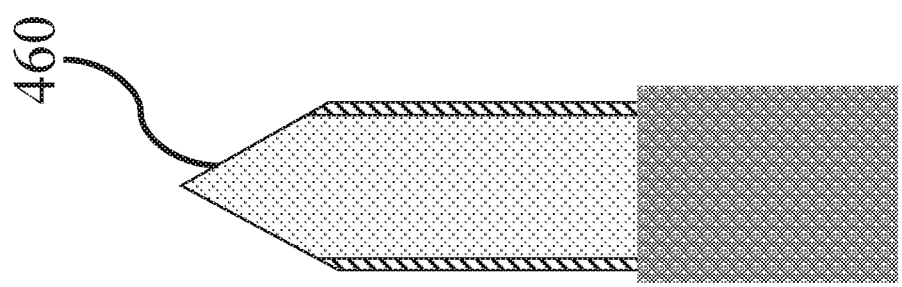
FIG. 4A is as diagram illustrating components of a cross section of a plug with a card according to some illustrative embodiments.

FIG. 1E is a diagram illustrating a substrate 100 after beveling the edge. FIG. 1F is a cross sectional diagram of substrate 100 at cross section line AA after beveling the edge. FIGS. 1E and 1F illustrates example substrate 100 with one or more edges of leading edge side 195 (i.e., engagement points 118, 128, 138, 148, 158, and 168) rounded or beveled forming bevels 112, 122, 132, 142, 152, and 162 at engagement points 118, 128, 138, 148, 158, and 168, as shown in FIGS. 1E and 1F. As shown the bevels, such as bevel 152 can be formed by taking material off in an arc encompassing the top face and the bottom face of substrate 100. In some embodiments, the bevel is formed only on one side of the substrate. In some embodiments, the bevel can be formed in an arc (as shown by bevel 152), one or more straight angles, or any other form. For example, FIG. 4A show shows a cross section of beveled edge 460 where two edge bevels form a point, FIG. 4B shows a cross section of beveled edge 470 where three beveled edges form a three-sided bevel, and FIG. 4C shows a cross section of beveled edge 480 where a beveled edge is formed with two straight bevels and one curved bevel.

FIGS. 3A, 3B, 3C, and 3D depict a cross-sectional view of a substrate, such as cross section AA. Beveled edges are formed by any method of material removal. In some embodiments, contact leads on a substrate 300 (e.g., cards) are formed by electroplating with a common electrical connection 310 on the edge. This electrical connection can be removed with some embodiments of this disclosure. Contact edges can be formed by any process of removing material, such as an abrasive wheel 320. The material removal process can be used to create the setback engagement points (as described above). In some embodiments, the same material removal process can be used to create the beveled edges. For example, abrasive wheel 320 can follow path 325 to set the depth (i.e., sets engagement points 118, 128, 138, 148, 158, and 168 distances away from leading edge side 195) of the engagement point, and abrasive wheel 320 can follow path 335 to create bevel 360. In some embodiments, a first process can be used to set the depth of an engagement point and a second process can be used to create the bevel. For example, a larger or smaller wheel can be used, or a grinding process can be used to set the engagement points and laser ablation can be used to create the bevels. In some embodiments, removing material from the plug end (such as leading edge side 195) and the removing material from an edge, to form the bevels are performed simultaneously. In some embodiments, the one or more of the bevels (e.g., bevels 112, 122, 132, 142, 152, and/or 162) is different than the other bevels. For example, bevel 112 can be an arc with a 1 mm radius, bevel 122 can be an arc with a 1.5 mm radius, and bevel 132 can be an arc with a 2 mm radius. In some embodiments, each bevel's shape can be determined by a final application and/or defined during processing.

Substrate 500 has a beveled leading edge 510 formed at an angle such that each engagement point for each lead line has a different setback from leading edge 595, shown in FIG. 5. In some embodiments, the created edges forming engagement points do not have to be perpendicular to the leading edge (such as a leading edge 595), they can also be set at an angle or a curve. In some embodiments, each individual edge for the engagement point of each lead line can be set at a different angle.

Figure 6:
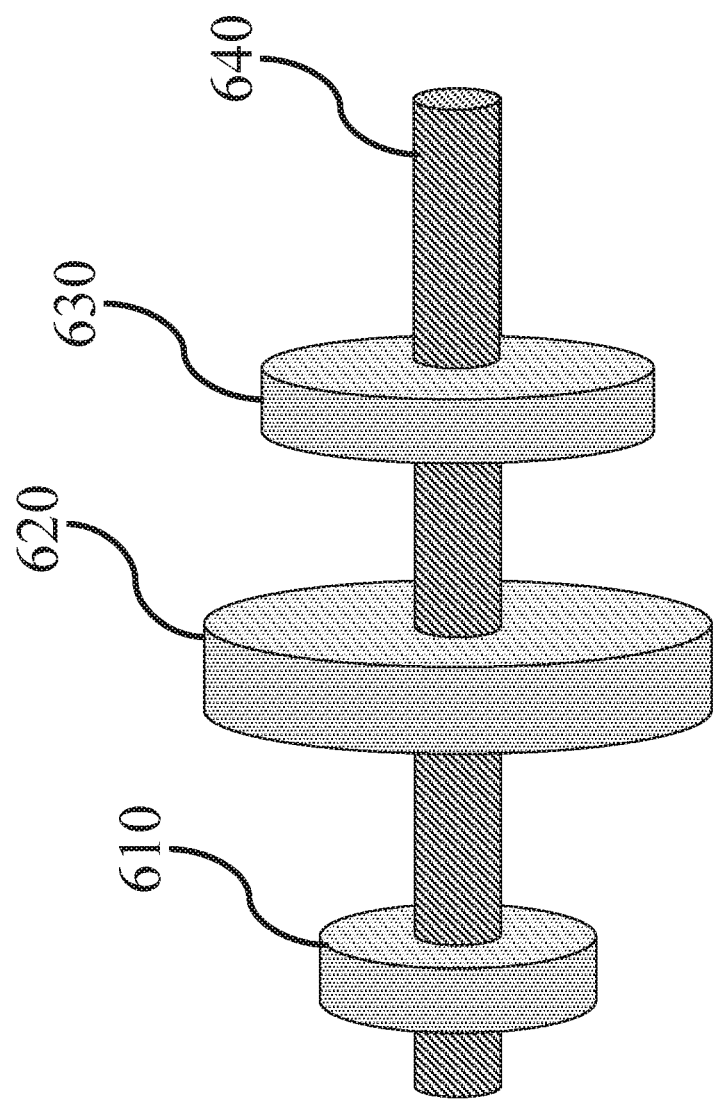
FIG. 6 is as diagram illustrating components of a grinding implement according to some illustrative embodiments.

The method of material removal can be any method capable of removing material from the card. FIG. 6 shows one exemplary embodiment of a material removal method. Three abrasive wheels 610, 620, and 630 are set on a common axis rod 640. In some embodiments, common axis rod 640 is also an abrasive wheel. In some embodiments, abrasive means rough such that it is able to take off material when rubbed against a surface. In some embodiments, all wheels 610, 620, and 630 and axis rod 640 are made of any material and take any form capable of removing material. For example, abrasive wheels 610, 620, and 630 can be abrasive brushes, diamond impregnated wheels, or abrasive stone wheels.

Figure 7:
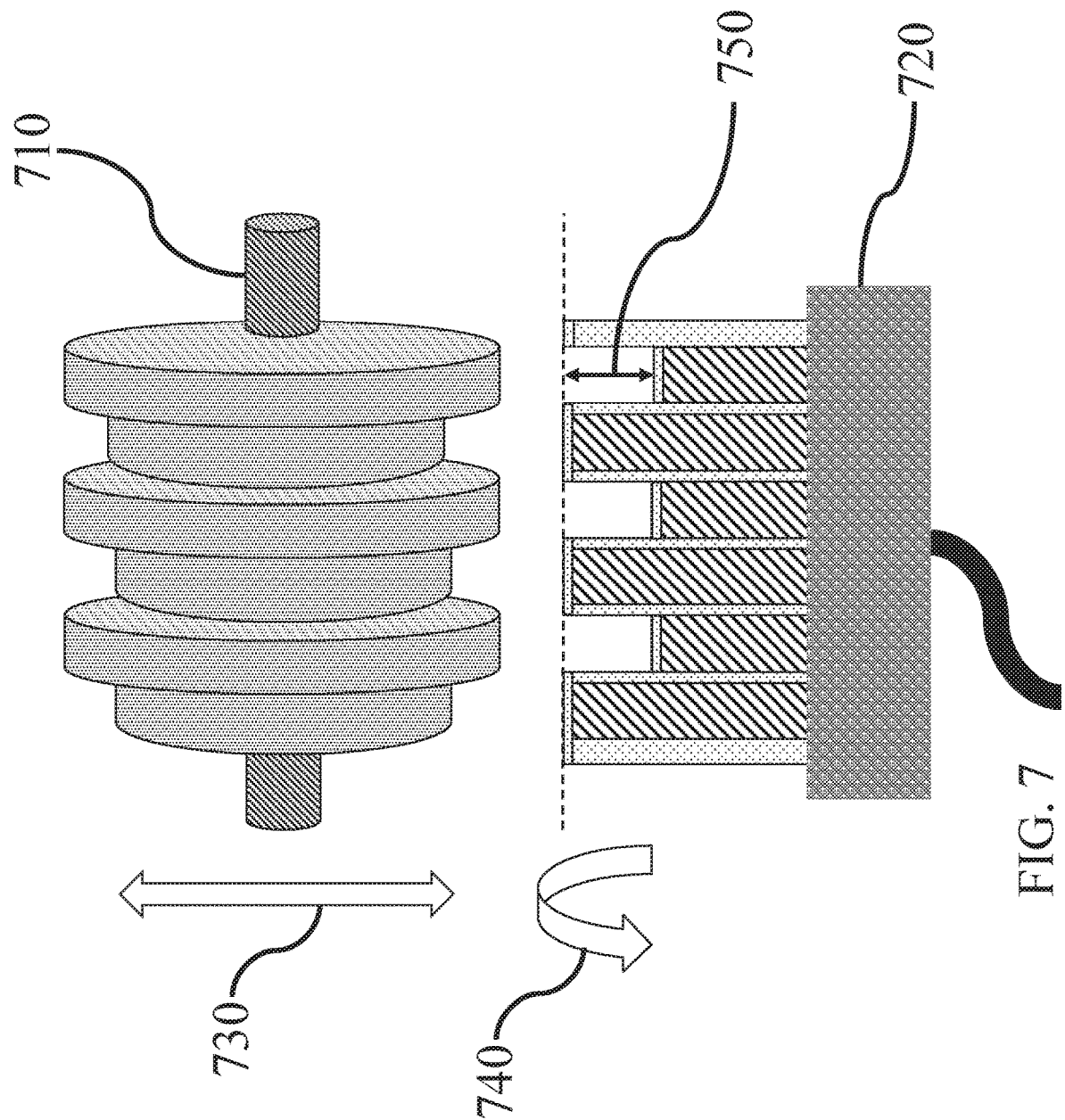
FIG. 7 is as diagram illustrating components of a grinding implement and a plug with a card according to some illustrative embodiments.

FIG. 7 shows an exemplary embodiment of the present disclosure, where an abrasive wheel removes material to form the setback contact points and the bevels. For example, grinding apparatus 710 can follow path 730 to create the setbacks (e.g., setback 750) for the contact points shown in substrate 720. Also, grinding apparatus 710 can follow path 740 to create the bevels shown in substrate 720.

FIG. 8 is a flow diagram illustrating a process for staggering card edges according to some illustrative embodiments of the present disclosure. Process 800 begins with the receipt of a card (such as substrate 100) with a plug end and one or more metal contact leads (such as metal leads 110, 120, 130, 140, 150, 155, and 160) running up to the plug end (i.e., leading edge side 195). This is shown in operation 810. The process removes material from the plug end (i.e., leading edge side 195) such that one or more of the engagement points (for example, engagement points 118, 128, 138, 148, 158, and 168) for one or more of the leads (such as metal leads 110, 120, 130, 140, 150, 155, and 160) are set back from the plug end resulting in staggered steps (see FIGS. 1C, 2, and 5) wherein an engagement point is where a metal contact lead will enter a receptacle. This is shown in operation 820. Material is removed from an edge formed for each engagement point of the card such that a bevel is created at the engagement point for each lead in operation 830.

Figure 2:
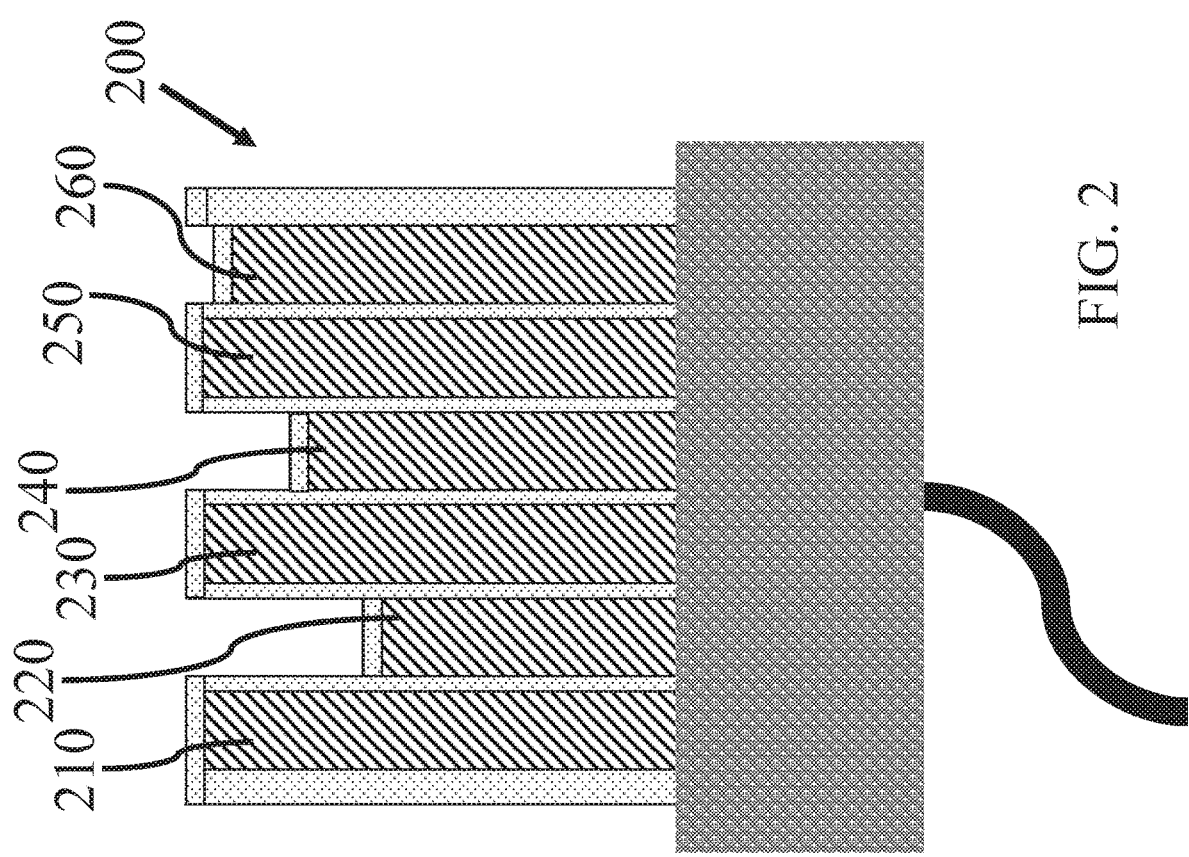
FIG. 2 is as diagram illustrating components of a plug with a card according to some illustrative embodiments.

In some embodiments, the removing, in operations 820 and 830, is selected from a group consisting of grinding, filing, laser ablation, waterjet cutting, plasma cutting, or a combination thereof. In some embodiments, staggered steps are formed with alternating deep and shallow cuts, as shown in FIG. 2. In a further embodiment, one or more of the staggered steps are parallel (such as the steps for lead lines 210, 230, and 250).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

"Present invention" does not create an absolute indication and/or implication that the described subject matter is covered by the initial set of claims, as filed, by any as-amended set of claims drafted during prosecution, and/or by the final set of claims allowed through patent prosecution and included in the issued patent. The term "present invention" is used to assist in indicating a portion or multiple portions of the disclosure that might possibly include an advancement or multiple advancements over the state of the art. This understanding of the term "present invention" and the indications and/or implications thereof are tentative and provisional and are subject to change during the course of patent prosecution as relevant information is developed and as the claims may be amended.

"And/or" is the inclusive disjunction, also known as the logical disjunction and commonly known as the "inclusive or." For example, the phrase "A, B, and/or C," means that at least one of A or B or C is true; and "A, B, and/or C" is only false if each of A and B and C is false.

The invention claimed is:

1. A method for creating staggered card edges comprising:
    receiving a card with a plug end and two or more metal contact leads running up to the plug end;
    removing material, via an abrasive wheel, from the plug end such that one or more engagement points for one or more of the leads are set back from the plug end resulting in staggered steps,
        wherein an engagement point is where a metal contact lead will enter a receptacle; and
    removing material from an edge formed for each engagement point of the card by revolving the abrasive wheel in an arc around the plug end such that beveled edges are created at the one or more engagement points for each lead.

2. The method of claim 1, wherein the abrasive wheel is a multitiered abrasive wheel comprising a first abrasive wheel with a first diameter and a second abrasive wheel with a second diameter.

3. The method of claim 1, wherein the staggered steps are formed with alternating deep and shallow cuts.

4. The method of claim 1, wherein the removing material from the plug end and the removing material from an edge are performed simultaneously.

5. The method of claim 1, wherein one or more of the staggered steps are parallel.

6. The method of claim 1, wherein the beveled edges are curved.

7. The method of claim 1, wherein the beveled edges are formed as two or more flat edges.

8. The method of claim 1, wherein the card is a connection card in a plug.

9. A system comprising:
    a multitiered abrasive wheel for removing material from an edge of a card at a first dept and a second depth;

a mechanism for plunging the abrasive wheel down the end of the card; and a second mechanism for revolving the abrasive wheel in an arc thereby creating a first beveled edge on the card at the first depth and a second beveled edge on the card at the second depth by removing material from the edge of the card.

10. The system of claim 9, wherein the staggered steps are formed with alternating deep and shallow cuts.

11. The system of claim 9, wherein the removing material from the plug and the removing material from an edge are performed simultaneously.

12. The system of claim 9, wherein the beveled edges are curved.

13. The system of claim 9, wherein the beveled edges are formed as two or more flat edges.

14. The system of claim 9, wherein the card is a connection card in a plug.

15. A structure comprising:
   a card for an electronic device with a plug end,
      wherein the plug end is to be plugged into a receptacle;
   staggered steps on the plug end corresponding to one or more metal leads on the card,
      wherein each metal lead on the card is isolated on a single staggered step,
      wherein each staggered step has a different distance from an outermost edge of the card;
   beveled edges on at least the staggered steps; and
   a progressive stepping of each staggered step such that, starting at a first side of the card, a first step is at the outermost edge of the card, a second step is a first distance away from the outermost edge, and a third step is a second distance away from the outermost edge,
   wherein the second distance is greater than the first,
   wherein the side of the card is perpendicular to the outermost edge of the card,
   wherein the second step abuts the first step and the third step abuts the second step.

16. The structure of claim 15 wherein one or more of the staggered steps are parallel.

17. The structure of claim 15 wherein the beveled edges are curved.

18. The structure of claim 15 wherein the beveled edges are formed as two or more flat edges.

19. The structure of claim 15 wherein the card is a connection card in a plug.

\* \* \* \* \*